United States Patent
Baccini et al.

(10) Patent No.: US 10,224,446 B2
(45) Date of Patent: Mar. 5, 2019

(54) BACKSHEET FOR PHOTOVOLTAIC PANELS WITH DOUBLE CONTACTING FACE CONDUCTIVE ELEMENTS OF THE NON-THROUGH TYPE AND ASSEMBLY METHOD

(71) Applicant: VISMUNDA SRL, Venice (IT)

(72) Inventors: Elisa Baccini, Carbonera (IT); Stefano Scolari, Carbonera (IT)

(73) Assignee: VISMUNDA SRL, Padua (IT)

( * ) Notice: Subject to any disclaimer, the term of this patent is extended or adjusted under 35 U.S.C. 154(b) by 170 days.

(21) Appl. No.: 15/035,431

(22) PCT Filed: Nov. 18, 2014

(86) PCT No.: PCT/IB2014/002470
§ 371 (c)(1),
(2) Date: May 9, 2016

(87) PCT Pub. No.: WO2015/075523
PCT Pub. Date: May 28, 2015

(65) Prior Publication Data
US 2016/0300968 A1    Oct. 13, 2016

(30) Foreign Application Priority Data
Nov. 21, 2013    (IT) .............................. TV2013A0193

(51) Int. Cl.
*H01L 31/049*    (2014.01)
*H01L 31/02*    (2006.01)
*H02S 40/34*    (2014.01)

(52) U.S. Cl.
CPC ...... *H01L 31/049* (2014.12); *H01L 31/02008* (2013.01); *H02S 40/34* (2014.12); *Y02E 10/50* (2013.01)

(58) Field of Classification Search
CPC .. H01L 31/049; H01L 31/02008; H02S 40/34
(Continued)

(56) References Cited

U.S. PATENT DOCUMENTS 6,906,253 B2 * 6/2005 Bauman ................ H01L 31/048
136/244
2007/0012352 A1    1/2007 Wohlgemuth
(Continued)

OTHER PUBLICATIONS

International Search Report for corresponding International Application No. PCT/IB2014/002470.

*Primary Examiner* — Jayne L Mershon
(74) *Attorney, Agent, or Firm* — Egbert Law Offices, PLLC

(57) ABSTRACT

Backsheet for photovoltaic panels with conductive interface elements intended to simplify the electrical connection of the terminal points of the circuit to the back junction box. The conductive elements are of the non-through type through the backsheet, with double contacting face, and are integrated on the front side towards the cells within recessed seats and in correspondence of through-holes in such a way as to enable an electrical connection by contact from the back side through the holes, in a guided way, by means of respective conductive elements protruding and fastened to the junction box. In particular, such a simplified contacting solution can be realized with extreme precision, without manual operations and at extremely low costs, with an automated assembly method.

3 Claims, 9 Drawing Sheets

Figure 1A:
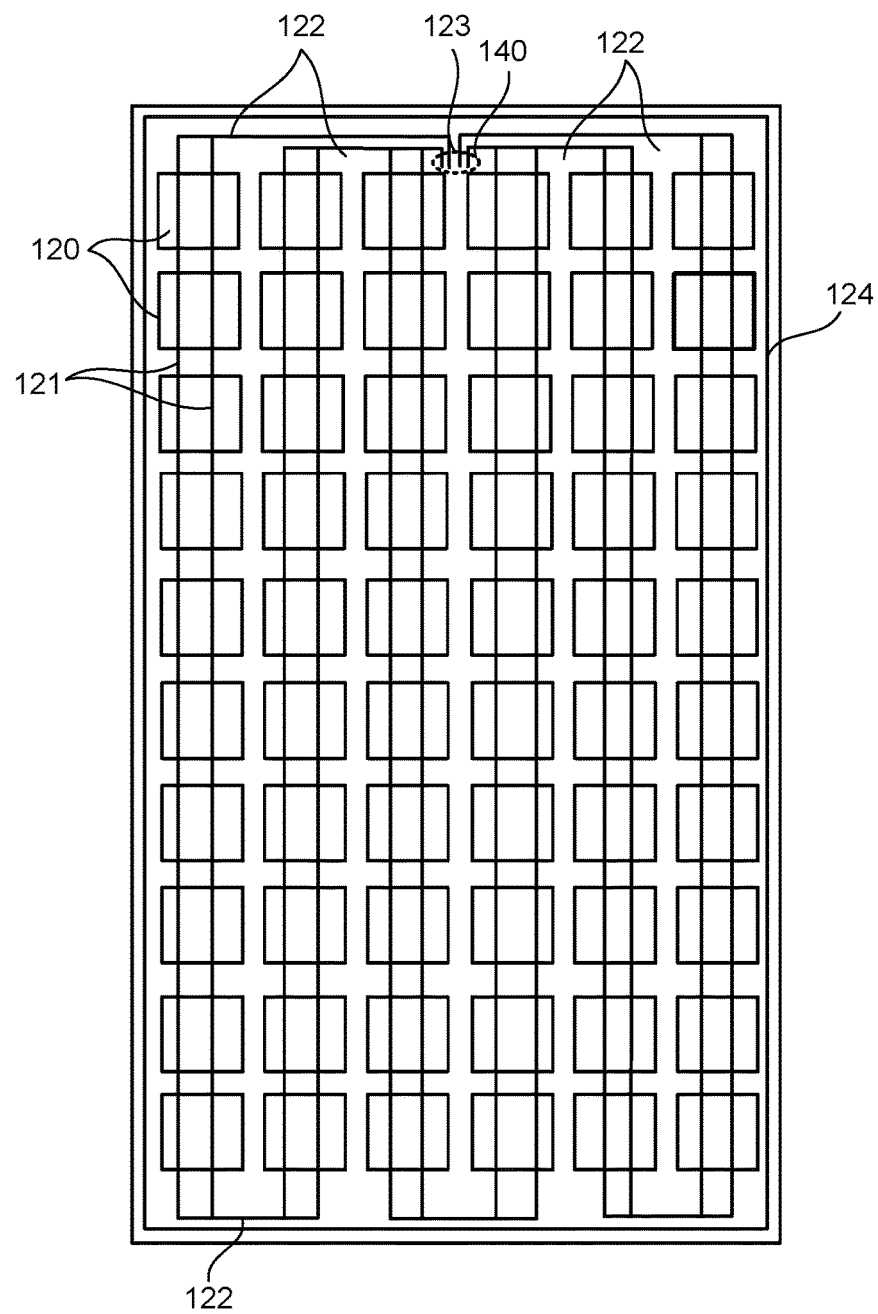

(58) Field of Classification Search
USPC .......................................................... 136/251
See application file for complete search history.

(56) References Cited

U.S. PATENT DOCUMENTS

2007/0227581 A1* 10/2007 Chen .................. G02B 19/0042
136/246
2007/0283996 A1    12/2007 Hachtmann et al.
2012/0152349 A1     6/2012 Cao et al.

* cited by examiner

BACKSHEET FOR PHOTOVOLTAIC PANELS WITH DOUBLE CONTACTING FACE CONDUCTIVE ELEMENTS OF THE NON-THROUGH TYPE AND ASSEMBLY METHOD

The present invention relates to a backsheet for photovoltaic panels with double contacting face conductive elements of the non-through type for the simplified electrical connection of the back junction box; furthermore, another object of the invention is the related assembly method and the photovoltaic panel obtained from said backsheet.

FIELD OF THE INVENTION

The invention finds particular application in the industrial sector of photovoltaic panels; in particular, one describes an advantageous solution of contacting of the back junction box by means of particular conductive elements of the non-through type integrated in the closing back panel which is conventionally called backsheet in the English language. The described solution is suitable both for panels with conventional cells having two faces of opposite electrical polarity, also called standard, and panels with back contacting cells, also called back-contact.

Nowadays, in principle, it is possible to consider as widely known conventional solutions of photovoltaic panels with cells of the standard type and also evolved solutions with cells of the back-contact type. For example, we would like to recall the conventional architecture called H-type, also called of first generation, whose basic components starting from the back side not exposed to the sun substantially are: a backsheet of protection from the weather, which is placed on the back side of the panel; the photovoltaic cells, of single-crystal or multi-crystal silicon, having the electrical contacts of opposite polarity placed respectively on the front and on the back; the strings intended to weld in series two by two the front and the back of the adjacent cells; the conductive tapes, also called ribbons in the English language, which connect in series said strings by interposing diodes in the junction box; two layers of encapsulating material, generally ethyl vinyl acetate (EVA), intended to enclose at the front and at the back said cells, said strings and said ribbons; a flat glass which encloses and protects the front side of the panel, exposed to the sun; a frame which encloses the perimeter of the panel; said junction box being placed on the back side of the backsheet for the purpose of collecting the contacts from the back connecting to said ribbons being generally connected by means of cables or other applied elements. The assembly process of these panels is generally carried out, excluding the phase of welding of the strings to the cells, mostly manually.

Still as an example, we recall an evolved solution of photovoltaic panel with back-contact architecture, also called of second generation, which allows to reduce manual working and increase the degree of industrialization and repeatability, the basic components of such a panel being described in detail in the following starting from the back side towards the front side exposed to the sun: a backsheet of the back-contact type, also called conductive backsheet, which includes an internal conductive metal layer for the electrical connection of the cells of the back-contact type, said layer being generally made by rolling with following selective removal; a plurality of photovoltaic cells of the back-contact type, of single-crystal or multi-crystal silicon, having the contacts both with positive and with negative electrical polarity placed at the back; a conductive material between said backsheet and the back faces of the cells, in correspondence of the contacts of different electrical polarity of the cells themselves; two layers of encapsulating material, generally EVA, the back layer of which is holed in correspondence of the contacts created by said conductive material, enclosing at the front and at the back all the above-described elements; an insulating material which is generally superimposed by silkscreen printing on said conductive backsheet having openings in correspondence of the zones of contact with the back polarities of said cells; a flat glass, a frame and a junction box as described above.

In particular, both in said panels of the conventional type and in said panels of the back-contact type it is the established practice to connect manually, after the rolling phase and prior to the fixing of the junction box on the back side, the end of said metal ribbons to the internal terminals of said box, making them pass through the corresponding through-holes on the backsheet.

Recently, variants for improving the production process are also known; for example, we would like to recall the completely automated solution for obtaining back-contact panels starting from a particular previously made multi-layer conductive backsheet as in ITTV2012A000211 (Baccini et al.). Furthermore, we would like to recall solutions aimed at facilitating back contacting by inserting conductive interface elements intended to facilitate the electrical connection between said ribbons and the junction box, which is fixed on the back of the photovoltaic panel after the rolling phase; such conductive elements, for example, being of the through and integrated type as in the documents ITTV20130059 (Baccini et al.) and ITTV20130060 (Baccini et al.).

The present invention describes an advantageous solution of a backsheet for photovoltaic panels which considerably simplifies the contacting to the back junction box; in particular, the proposed solution does not provide any handling during the phase of production of the backsheet, being realizable in a completely automated way, and also allows to eliminate the handling of the conductive elements during the assembly of said box, being electrically connected at the back by direct contact in a guided way.

PRIOR ART

For the purpose of determining the prior art related to the proposed solution a conventional check was made, searching public archives, which has led to find some prior art documents, among which:

D1: EP2139050 (Bakker et al.)
D2: ITTV2012A000211 (Baccini et al.)
D3: WO2012058053 (Meakin et al.)
D4: US20100108376 (Richter)
D5: US20110079284 (Wu)
D6: ITTV20130059 (Baccini et al.)
D7: ITTV20130060 (Baccini et al.).

D1 proposes an assembly process for panels of the back-contact type starting from a conductive backsheet on which the conductive adhesive material, the holed lower layer of encapsulating material, the cells, the upper layer of encapsulating material and the glass, with final rolling, are placed.

D2 describes an assembly process for panels of the back-contact type starting from a particular conductive backsheet called BCBS made separately and considered as a purchase component, which comprises a double layer of encapsulating material with a dielectric interposed, holed and placed on the conductive sheet that realizes the electrical circuits, being then rolled on the supporting backsheet; on said BCBS placed horizontally on a tray with the conductive layer upwards and with the areas of contacting of the cells already masked it is therefore possible to lay directly and automatically a conductive material, the cells, the upper layer of encapsulating material and the glass to be then subjected to the final rolling. A junction box is then placed on the back side of the panel to collect the contacts from the back, connecting to the electrical circuits of said BCBS.

D3 proposes a manufacturing process for panels of the back-contact type with the laying of conductive ribbons on a backsheet on which some adhesive material has been previously applied.

D4 describes a solution for a junction box which includes on its inside a clip-shaped conductive element in such a way as to facilitate the connection of the corresponding cables to the string terminals which conventionally come out of the back side of the panel.

D5 proposes a solution for a simplified electrical connection between the panel and the junction box, being made at the head by means of protruding elements connected to the string terminals and rolled in a coplanar way with the layers of the panel, supported and shaped in such a way as to enter complementary slots in the junction, in the form of male-female elements, being integrated externally at the head; such a solution, substantially, is of the type used in the electronic systems of connection between flexible circuits.

D6 and D7 describe methods of improved contacting of the back junction box, providing a conductive backsheet for back-contact cells arranged with recessed seats, and if necessary holed, where to insert conductive interface elements of the through type which are bent on both sides in such a way as to automatically connect the conductive layer, to allow the welding to the upper end of said elements and also the electrical connection to the lower end which comes out of the backsheet.

In conclusion it is reasonable to consider as known:
  a photovoltaic panel of first generation with cells of the standard type connected with said ribbons, including a supporting backsheet and a plurality of superimposed and rolled layers, being then holed for the contacting of the back junction box;
  a manual system of contacting of the junction box which is fixed at the back of the panel after the connection of the end of the ribbons corresponding to the string terminals, being pushed through through-holes;
  a photovoltaic panel of second generation with cells of the back-contact type and a conductive backsheet on which the layer of dielectric material in the form of an insulating mask, the conductive material, the lower encapsulating layer with centering of the holes on the contacts, the cells, the upper encapsulating layer, the glass, being then rolled and also being holed for the contacting of the back junction box;
  a system of contacting of the junction box by means of conductive interlace elements applied and integrated in the backsheet, being protruding for a simplified connection of the terminals;
  an advantageous solution for a panel of second generation which comprises a multi-layer conductive backsheet integrating the functions of dielectric mask and lower encapsulating layer and is also arranged with holes and recesses to facilitate the following contacting of the back junction box;
  a simplified system of contacting of the junction box by means of passing-through conductive elements which are integrated in a conductive backsheet for cells of the back-contact type, being arranged for this purpose with recessed seats and if necessary already holed, wherein said conductive elements are inserted and then bent on both sides in such a way as to electrically connect to the conductive layer, allow the welding of the upper end and also allow the electrical connection of the junction box to the lower end of the conductive element which comes out at the back of the backsheet.

Drawbacks

In conclusion, we have observed that the described conventional and known solutions have drawbacks or anyway some limits.

Firstly, it has been found that the complexity of the circuit layout of the series connection between the cells by means of strings and ribbons makes the phase of electrical connection of the junction box on the back of the photovoltaic panel extremely critical; in particular, the risks of missed or insufficient electrical contacting, movement of the circuit and/or of the cells during the assembly phase and short-circuits are widely known.

Secondly, it has been found that the great handling in the process of assembly and electrical connection of the back junction box is also due to the complex and expensive automation of the process, in particular in case of panels with cells of the standard type; in that case, the high consequent probability of errors, reprocessing and waste is known with consequent effects on quality, reliability and increase in the cost of the finished product.

Thirdly, it has been found that in the case of photovoltaic panels using a conductive backsheet and back-contact cells, the electrical connection of the back junction box implies the complete uncovering of the conductive layer which is brought to view removing protection and support, therefore introducing a high risk of breaking said conductive layer which is very thin, being for example between 35 and 60 micrometers; the possible residues of polymeric cover on the conductive layer on the other hand jeopardize the effectiveness of the electrical connection to the junction box.

Fourthly, it has been found that the quality control and the checks for the correct contacting and fixing of the back junction box are of difficult realization, particularly in the case of large production volumes; such checks are generally entrusted to expert operators who carry out visual checks or the panel is checked only at the end of the manufacturing cycle.

Fifthly, it has been found that labour cost greatly affects the process for making said electrical connection to the junction box.

Furthermore, in the solutions recently proposed for innovative assembly processes of photovoltaic panels, particular attention was paid to the improvement of the electrical connection between the cells and also in the manufacturing of advantageous multi-layer structures, for example in D1, D2 and D3, where however there are conventional contacting solutions for the back junction box. It has also been found that the production processes that start from a backsheet prepared separately as a semi-finished product, such as in D2, are particularly suitable to be arranged in such a way as to facilitate said back contacting, however an optimized solution for this arrangement is not described.

It is also known that the solutions intended to facilitate the connection of flexible conductive elements, such as ribbons or cables, which cross the panel at the back in through-holes for the fixing to the end in clamps or shaped clips, such as in D4, do not solve the difficulty of taking a conductive element from the front side, in correspondence of the string terminals, to the back side; such simplified fixing solutions, in particular, do not eliminate manual operations. D5 proposes an innovative contacting solution which is complex in its realization and extremely delicate, being little suitable for a large photovoltaic panel that is exposed for years to the weather; such a contacting solution, furthermore, is binding/BOUND to a particular panel structure combined with a particular junction box.

D6 and D7 propose advantageous solutions of conductive backsheets which are arranged for the purpose of facilitating back contacting, with recessed seats and passing-through conductive elements already inserted, such arrangements being realizable during the automated production process; however, there is the problem of the bending of the end of said conductive elements, said operation being of difficult automatization and also requiring extreme precision for the purpose of integrating correctly in the recessed seats, as well as the problems linked to the following automated movements of backsheets or semi-finished products with bent and protruding metal elements on the back. Furthermore, it is observed that the manual operations of contacting of the string terminals on the side towards the cells are eliminated and however the contacting and the assembly of the back junction box are not very simple.

Therefore on the market there are no backsheets for photovoltaic panels, both of the non-conductive type for photovoltaic panels with cells having faces of opposite polarity and of the conductive type with back-contact cells, which are already arranged for an optimized electrical connection of the terminal points of the front circuit to the back junction box, being of easy and fast realization, without manual operations, both on the front side and at the back, and reducing faultiness; moreover, an assembly method of such backsheets which is convenient and advantageous in terms of working times and costs, with high quality standards and for large production volumes is not known.

Hence the need for the companies of the sector to find solutions which are more effective with respect to the existing solutions; the aim of the present invention is also to solve the described drawbacks.

SHORT DESCRIPTION OF THE INVENTION

This and other aims are achieved by the present invention according to the characteristics as in the included claims, solving the arising problems by means of a backsheet for photovoltaic panels with conductive interface elements intended to facilitate the electrical connection of the terminal points of the circuit to the back junction box; said conductive elements are of the type not passing through the backsheet, with double contacting face, and are integrated on the front side towards the cells inside recessed seats and in correspondence of through-holes in such a way as to enable an electrical connection by contact from the back side through said holes, in a guided way, by means of corresponding conductive elements protruding from and fastened to the junction box. In particular, such a solution for simplified contacting is realizable with extreme precision, without manual operations and at extremely reduced costs, with an automated assembly method.

Aims

In this way by the considerable creative contribution the effect of which has allowed to reach a considerable technical progress, some aims and advantages are achieved.

A first aim of the invention was to solve the main problems mentioned above and in particular to facilitate the electrical connection of the junction box placed on the back side of the photovoltaic panel after the rolling phase, be it composed by back-contact solar cells or composed by standard cells, with low costs, with high precision and repeatability, easy control, excellent quality of the result and long life.

A second aim of the invention, linked to the first, was to eliminate manual operations in the electrical connection of said back box allowing for a contacting by contact of the reversible type.

A third aim of the invention was to find an automatic assembly method of said backsheet for photovoltaic panels arranged for simplified electrical connection, in such a way as to obtain a high production capacity for the carrying out of said operation of electrical connection in a reduced occupation surface, reducing costs.

A fourth aim of the invention was to eliminate the known faults linked to the manual operations of holing, insertion and processing of conductive elements in the backsheet, being made in an automatic way and also carrying out the complete arrangement of the backsheet for said simplified electrical connection of the back junction box. This arrangement can occur advantageously and without affecting the production cycle also in the evolved systems of production of panels with cells of the back-contact type; for example, one should remember the automated production systems for panels with multi-layer conductive backsheets, for example including integrated encapsulating and dielectric layers, obtaining a significant reduction in industrial costs with respect to the known art and a high value added on the product for the maker of photovoltaic panels, also contributing to making renewable energy sources more available and affordable.

A fifth aim was to provide an extremely versatile and reliable solution for simplified contacting being suitable both for conductive backsheets of the conventional type and for conductive backsheets of the evolved multi-layer and multifunction type, and also for the backsheets without conductive layer for standard cells. In any type of backsheet, in fact, if arranged as provided by the invention, it is possible to obtain at the back conductive bump contacts integral with the backsheet, resistant to stresses and to welding, and also firmly connected to the electrical circuit of the solar cells in such a way that the connection of the junction box on the back of the panel is particularly easy and also realizable with automatic devices, improving the level of quality of the finished product.

Another aim was to allow the automatic control of the so made connections, allowing a significant increase in the repeatability and in the quality standard of the finished product.

An additional aim, linked to the previous ones, was to provide high production flexibility.

These and other advantages will appear from the following detailed description of some preferred embodiments, with the aid of the schematic drawings enclosed whose details of execution are not to be considered limitative but only illustrative.

CONTENT OF THE DRAWINGS

Figure 1B:
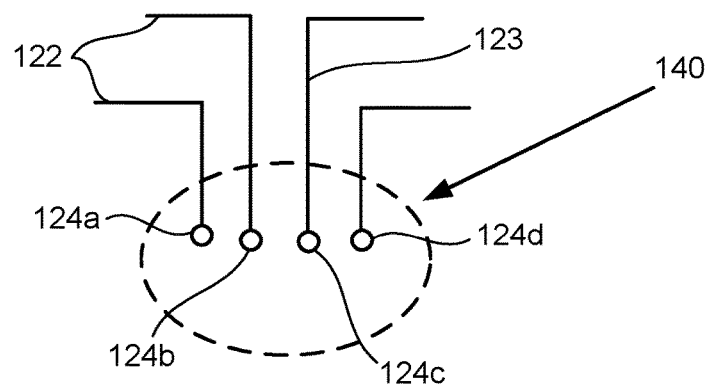

FIGS. 1a-b orthogonally represent a conventional panel with standard cells made according to the known art, in particular FIG. 1b being an enlarged detail of the zone of connection of the string terminals to the junction box.

Figure 1C:
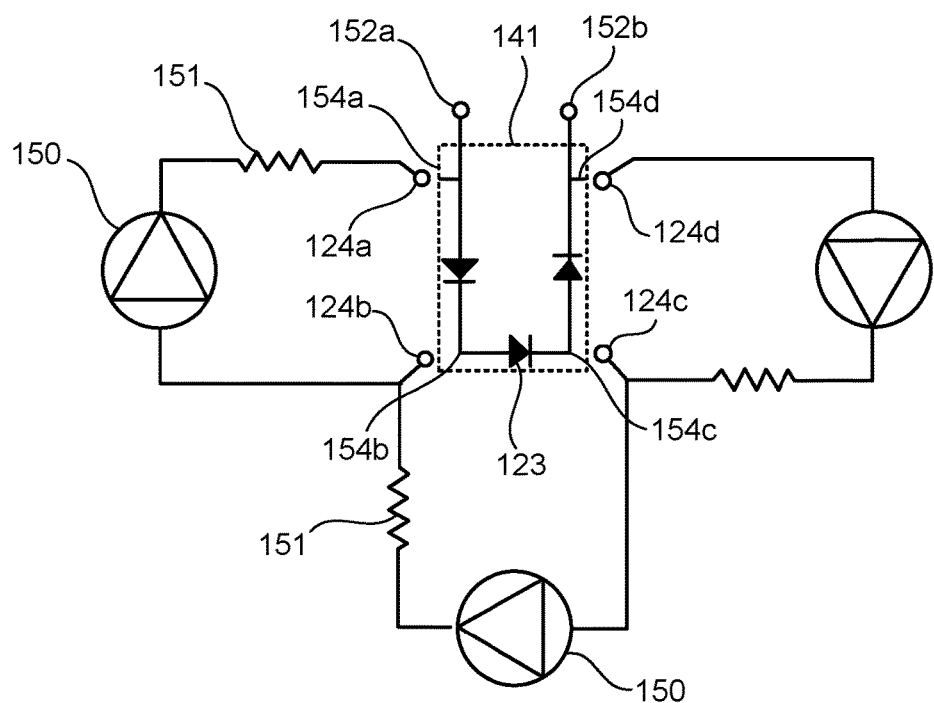

FIG. 1c shows an equivalent wiring diagram of the strings of the cells, which make up a photovoltaic panel and of the back junction box according to the known art, as in FIGS. 1a-b.

Figure 2A:
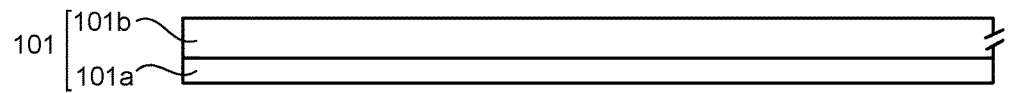
Figure 2B:
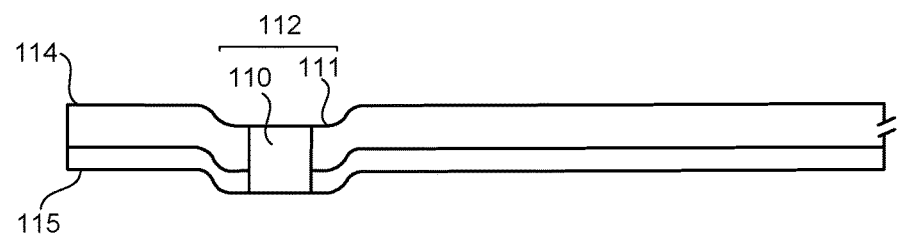
Figure 2C:
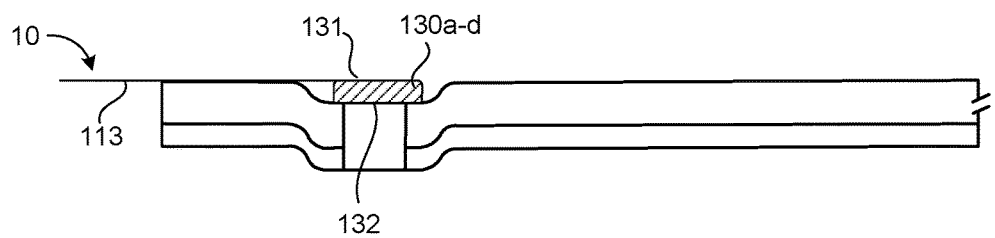

FIGS. 2a-c show, in schematic sectional views, a backsheet for photovoltaic panels with cells of crystalline silicon of the standard type which is arranged for the simplified contacting of the back junction box, according to the invention, said backsheet being shown in the configuration prior to said arrangement (FIG. 2a), with incomplete arrangement (FIG. 2b) and with complete arrangement (FIG. 2c) with the integration of the double contacting face conductive elements.

Figure 2D:
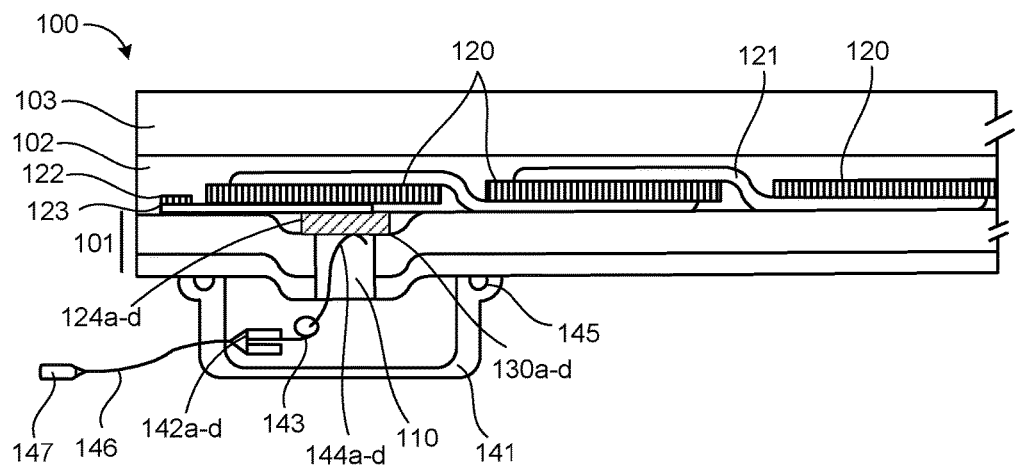

FIG. 2d shows, in a schematic sectional view, a photovoltaic panel with cells of crystalline silicon of the standard type fully assembled, comprising said backsheet as in FIG. 2c and also comprising the back junction box with the spring conductive elements protruding for the contacting across the hole, according to what is provided by the invention.

Figure 3A:
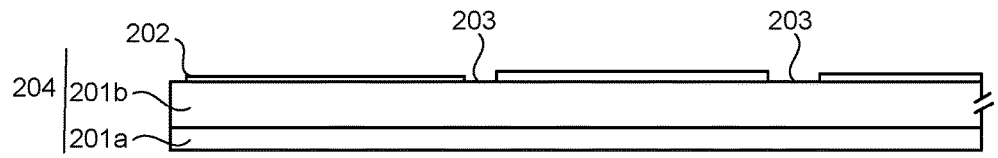
Figure 3B:
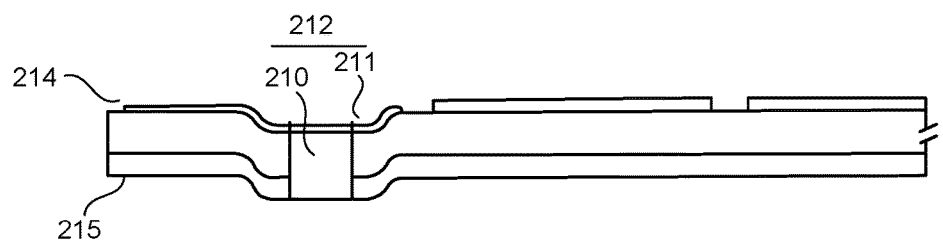
Figure 3C:
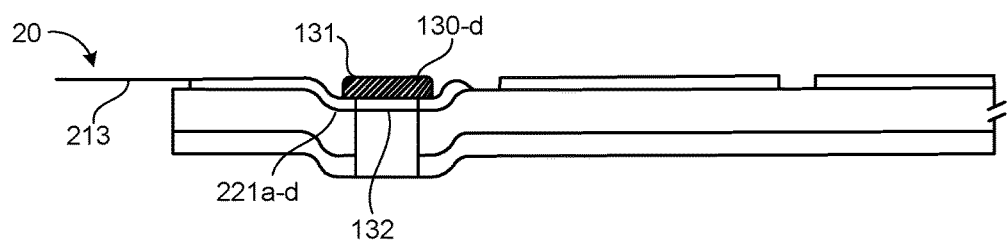

FIGS. 3a-c show, in schematic sectional views, a conductive backsheet for photovoltaic panels with cells of crystalline silicon of the back-contact type which is arranged for the simplified contacting of the back junction box, according to the invention, said conductive backsheet being shown in the configuration prior to said arrangement (FIG. 3a), with partial arrangement (FIG. 3b) and with complete arrangement (FIG. 3c) with the integration of the double contacting face conductive elements.

Figure 3D:
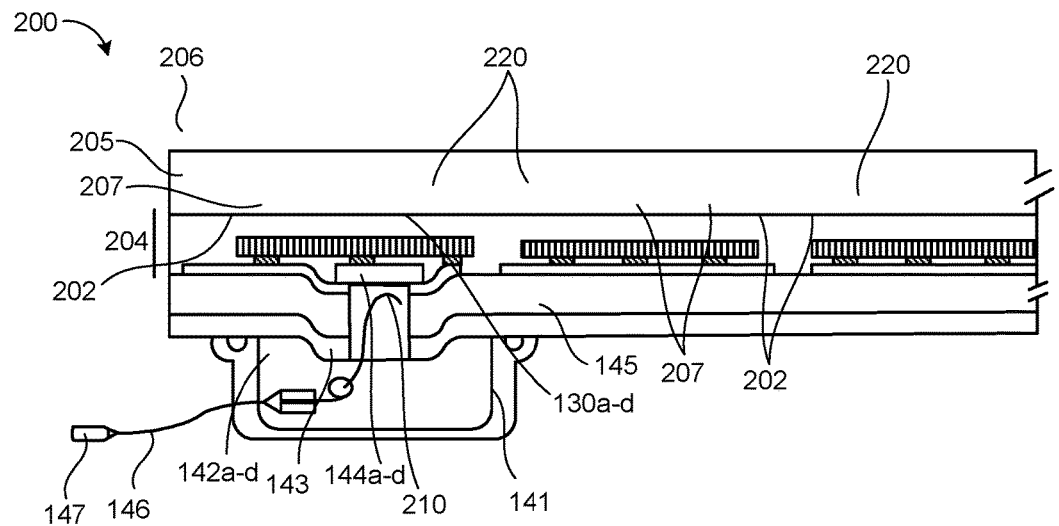

FIG. 3d shows, in a schematic sectional view, a photovoltaic panel with cells of crystalline silicon of the back-contact type fully assembled, comprising said conductive backsheet as in FIG. 3c and also comprising the back junction box with the spring conductive elements protruding for the contacting across the hole, according to what is provided by the invention.

Figure 4A:
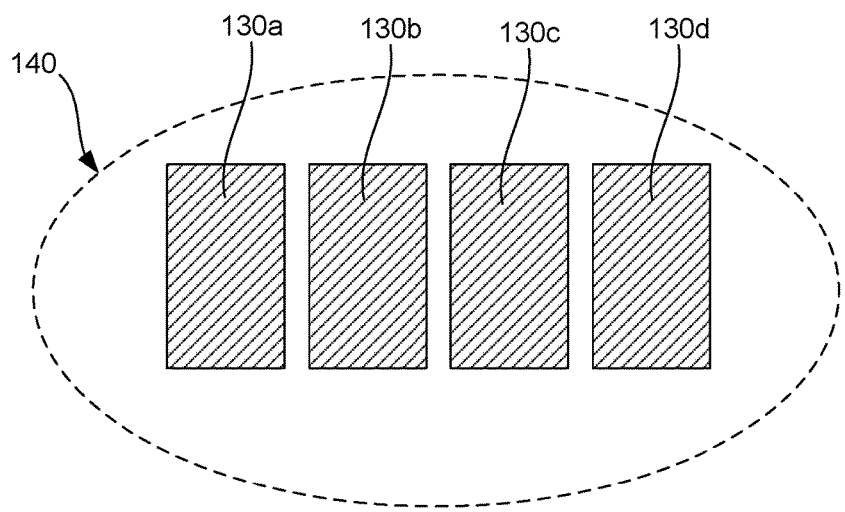
Figure 4B:
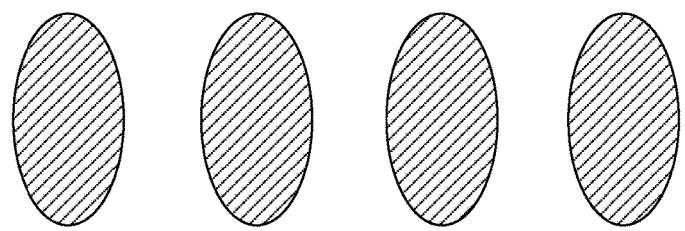
Figure 4C:
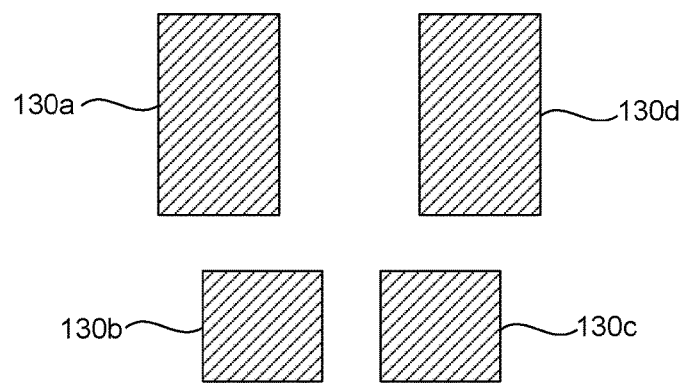
Figure 4D:
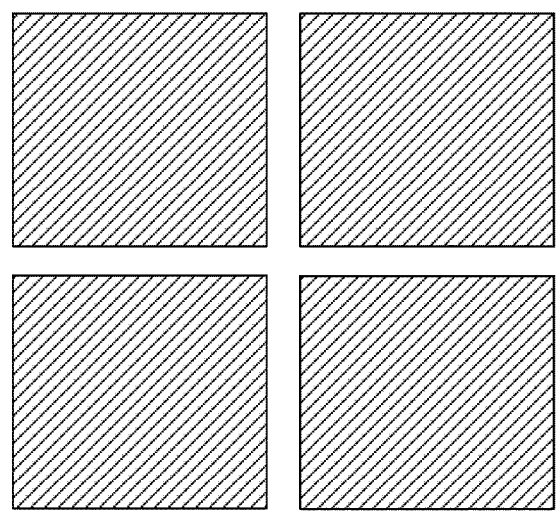

FIGS. 4a-d show in schematic orthogonal views, as a non-exhaustive example, different solutions of configuration and of arrangement of the integrated double contacting face conductive elements as provided by the invention being related to the particular cases of four aligned terminals, as in FIGS. 4a-b, or placed in symmetrical pairs as in FIGS. 4c-d.

Figure 5A:
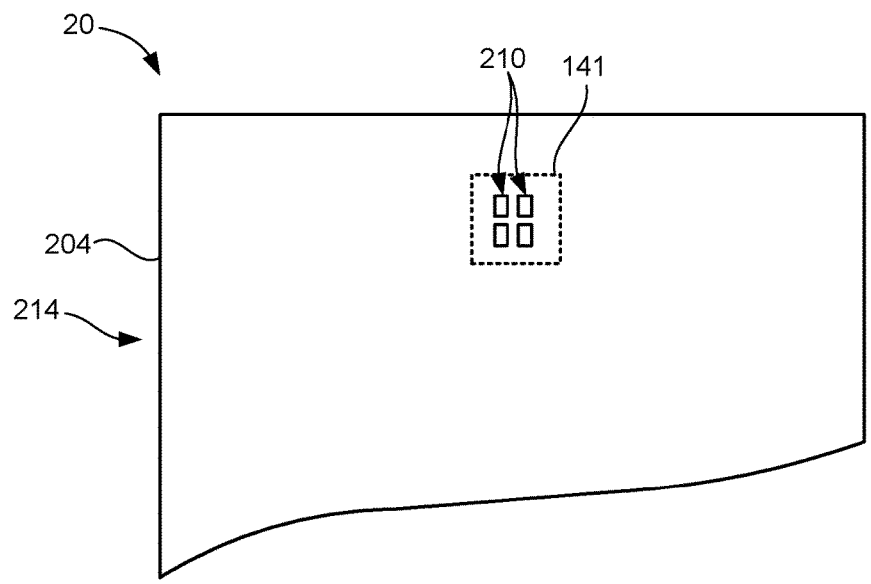
Figure 5B:
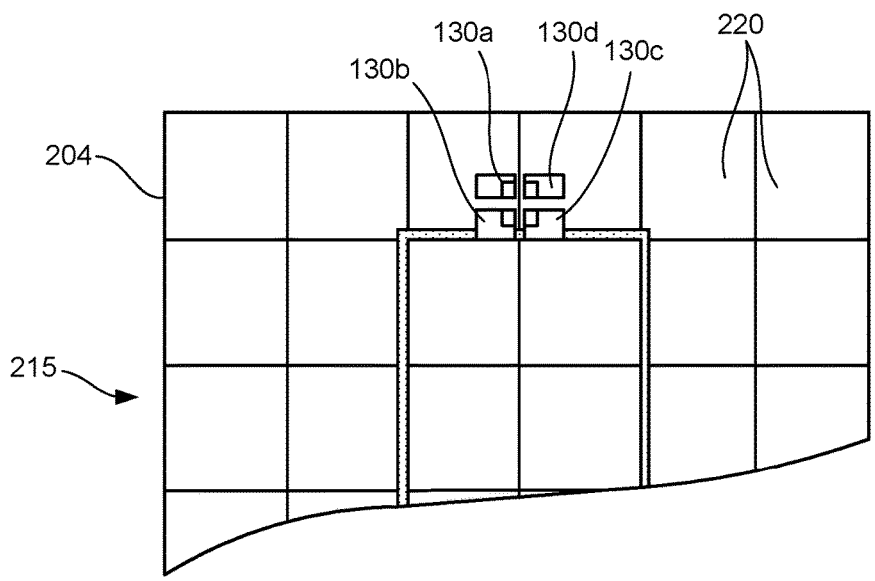

FIGS. 5a-b show in schematic orthogonal views, as an example, a conductive backsheet of the back-contact type arranged for the simplified contacting of the back junction box according to the invention, comprising four integrated double contacting face conductive elements placed in symmetrical pairs, as in FIG. 4d, FIG. 5a being from the side towards the junction box and FIG. 5b being from the side toward the cells.

Figure 6:
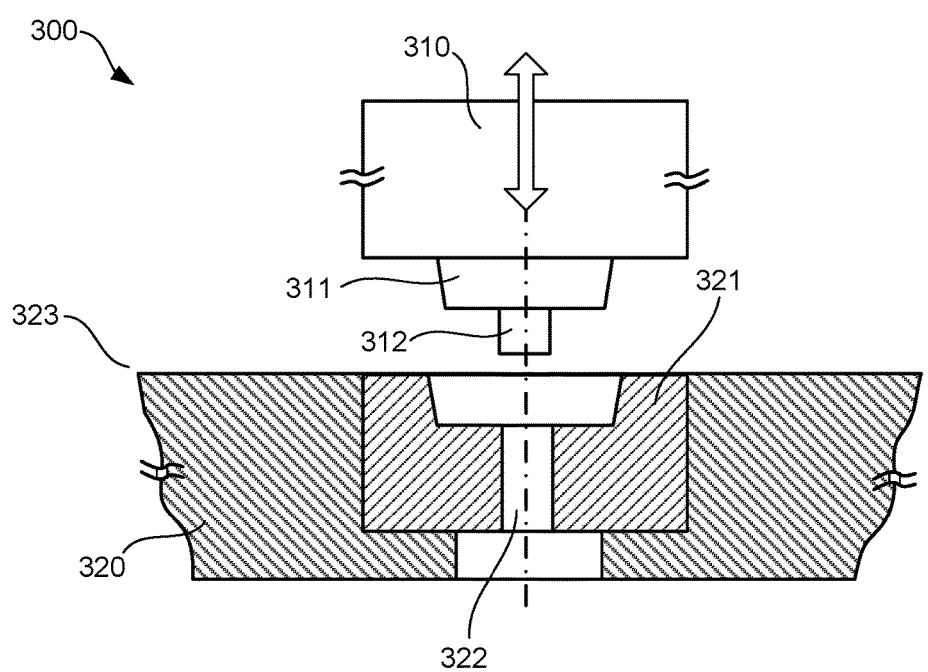

FIG. 6 shows, in a schematic sectional view, a device intended for the arrangement for the integration in the backsheet of the double contacting face conductive element, according to the invention, simultaneously realizing the through-hole and the recessed seat.

DESCRIPTION OF AT LEAST ONE EMBODIMENT OF THE INVENTION

The present invention describes a backsheet (10, 20) for photovoltaic panels (100, 200) with integrated conductive elements (130a-d) of the non-through type, with double contacting face (131, 132), for the simplified electrical connection of the front circuits to the back junction box (141); to this purpose a particular arrangement (110-2, 130a-d, 210-2) of the backsheet (10, 20) is provided to realize a stable and resistant conductive bump contact which is exposed at the back and is reachable through a hole (110, 210) for the direct contact of said junction box (141). The proposed solution is suitable both for panels (100) consisting of solar cells (120) of crystalline silicon of the standard type (FIG. 2d), having the two faces of opposite electrical polarity, and for panels (200) consisting of solar cells (220) of crystalline silicon of the back-contact type (FIG. 3d) having both electrical polarities on the shadow face of each cell and electrically connected by the conductive layer (202, 203) of a backsheet of the conductive type (204).

In a particularly advantageous case for production and quality purposes, for panels with back-contact cells it is possible to provide a conductive backsheet also of the multi-layer and multifunction type with an integrated encapsulating and dielectric layer, as described in the following; it is observed that, however, the solution for a simplified electrical connection provided by the invention is extremely versatile being realizable on any known type of backsheet thanks to the double contacting face (131,132) of said conductive element (130a-d). In particular, said conductive element is of the non-through type being firmly integrated in recessed seats (111, 211) to enable an easy connection of the terminal points of the front circuit in each of the two types of cell (120, 220) and also to simultaneously realize on the back side, in correspondence of the through-holes (110, 210), a conductive bump contact corresponding to the second face (132) which is stable and uncovered in order to enable the fast and reversible direct contacting from the back of said junction box (141) (FIGS. 2d, 3d).

As a non-exhaustive example, said conductive element (130a-d) has said contacting faces (131,132) essentially flat and parallel to each other; in an alternative and advantageous configuration suitable to improve the welding with ultrasonic sonotrodes, at least one of said faces (131,132) can comprise small cusps in such a way as to improve the intensification of the high-frequency vibrations.

In more detail with regard to the arrangement (110-2, 210-2, 130-2) of the zone of connection (140) of the terminal points (124a-d, 221a-d) of the front circuit to the back junction box (141), it is provided that said integrated conductive element (130a-d) has a thickness equal to the depth of said recessed seat (111, 211) obtained on the front side (114, 214) of said backsheet (101, 204), in such a way that the first contacting face (113), facing the cells, is coplanar (113, 213) to the supporting surface of said cells (FIGS. 2b-c, 3b-c); in said recessed seat there is at least one through-hole (110, 210) which is inside the second face (132) of each integrated conductive element (130a-d), being in correspondence of each electrical connection point (154a-d) on the back side (114, 214) of the backsheet and of each terminal point of the circuit (124a-d, 221a-d) on the front side (115, 215), see the tables of the known prior art (FIGS. 1a-c).

In particular, said integrated conductive elements (130a-d) are with double contacting face (131,132) in such a way as to realize two opposite conductive bump contacts, resistant and stable, being fixed in an irreversible way to the backsheet (101, 204) for example by welding or conductive adhesion, which bump contacts correspond respectively to the first (131) and to the second (132) face of said conductive element (130a-d) (FIGS. 2c, 3c). In the case of a backsheet of the standard type (101), non-conductive, each terminal point of the circuit (124a-d) coming from the ribbons is electrically connected on said first face (131) like a front bump contact (FIGS. 2c-d); in the case of a conductive backsheet of the back-contact type (204), on the other hand, said second face (132) is automatically connected to the conductive layer (202) which comprises the circuits corresponding to the single strings with the respective terminals (221*a-d*), like a back bump contact (FIGS. 3*c-d*).

Furthermore, through each through-hole (110, 210), said second face (132) also allows to connect each electrical connection point (154*a-d*) in said junction box (141), which is generally near the diodes (143). To this purpose, into said through-hole one inserts a contacting means which, in correspondence of said electrical connection point, is fastened in a protruding way integral with said junction box (141) to make a reversible electrical connection, by contact, on said second face (132) of each integrated conductive element (130*a-d*). In the preferred embodiment (2*d*, 3*d*), such spring conductive elements (144*a-d*) are of metal and of a width smaller than said through-holes (110, 210) in such a way as to enable their easy insertion or extraction, without side interferences, jointly to the assembly of the junction box (141, 143), and also are of a length greater than the depth of said holes (110, 210) to enable the electrical contact with suitable pressure and stability on said second face (132), being loaded. Said spring conductive elements (144*a-d*) therefore act as a bridge between the electrical connection points in the back junction box (141, 154*a-b*) and the terminal points of the circuit (124*a-d*, 221*a-d*) on the front side (114, 214), interfacing on the upper part with said second face (132) and on the lower part with the diodes (143); to this purpose, therefore, the particular shape of the box (141) is not binding but it is advantageous that each spring conductive element (144*a-d*) is connected to it, fastened and protruding, as described above.

It is observed that, nowadays, the conventional junction boxes which are electrically connected by means of contacting means fastened to them provide their welding or locking for the purpose of keeping the contact and correct positioning over time. The invention, on the other hand, thanks to said contacting means fastened to the box and protruding, made as described above, which are inserted into said holes in a guided and stable way and with no possibility of error, ensures the correct contact even without welding, which however can be carried out for safety reasons but it is not compulsory.

In an alternative embodiment the invention can also provide the use of a conventional junction box with fixed terminals, instead of said spring conductive elements (144*a-d*), welding to the conductive bump contacts exposed at the back (132) the conductive ribbons as in the known art, thus giving up the advantage of the completely automated assembly of the back junction box but maintaining all the advantages previously described with reference to the automated preparation of the backsheet, be it of the non-conductive standard type (10) or of the conductive type (20) for back-contact cells.

It is observed that in the description of the invention (FIGS. 1-5) one uses as a reference, as a non-exhaustive example, a conventional and known configuration of a panel with four terminal points of the circuit (124*a-d*) also called string terminals (FIGS. 1*a-b*) which at the back correspond, in the junction box (141), to an equivalent wiring diagram with four inward connection points (154*a-d*), three diodes (143) and two outward connections (152*a-b*) (FIG. 1*c*); in particular, such a configuration provides the integration in the backsheet of four double contacting face non-through conductive elements (130*a-d*) and then provides four spring conductive elements (144*a-d*) fastened to the box (141) and acting as a bridge, as described above. It is obvious that, depending on the specific panel configuration (100, 200) and according to the particular distribution and type of cells, the wiring diagram can change in the number of the components although keeping said simplified contacting solution integrated in the backsheet (10, 20) as provided by the invention, for example with a greater or smaller amount of connections and of conductive interface elements (130, 144).

Furthermore, it is observed that the specific shape of the integrated double contacting face conductive elements (130*a-d*) in some cases can be extremely simplified; for example, one should remember conductive elements shaped like discs or small plates or obtained by shearing or cutting from an unwound strip. In other cases, for example in conductive backsheets in which the circuits made up of the conductive layer have complex paths, it can be preferable to provide elaborate, asymmetrical or even diversified shapes being aimed at realizing said conductive bump contacts in the most advantageous way for the purpose of contacting, as described above. As a non-exhaustive example (FIGS. 4, 5), one can provide rectangular or elliptic elements equal to each other and aligned, (FIGS. 4*a-b*) or placed in symmetrical pairs (FIGS. 4*c-d*), also of different shape and width (FIG. 4*c*), the particular arrangement of such conductive elements being dependant on the terminal points of the front circuit and on the shape of the selected junction box. Always as an example (FIGS. 5*a-b*), a conductive backsheet (204) for back-contact cells (220) can be arranged for the simplified contacting of the back junction box (141) according to the invention, comprising on the front side (214) integrated conductive elements (130*a-d*) of rectangular shape, placed in symmetrical pairs, in such a way as to cover a wider surface of the through-holes (210) and expose at the back the faces to be contacted by means of said corresponding spring conductive elements (144*a-d*).

A backsheet (10, 20) configured as described above (FIGS. 2-5) and the photovoltaic panel (100, 200) which comprises it, are advantageously realizable industrially according to an assembly method which comprises the following operating phases (F1-F6), the first phases (F1-F3) being dedicated to the preparation of said backsheet (10, 20):
F1) making on the backsheet of through-holes in correspondence of each terminal point of the front circuit to be connected to the back junction box; F2) making of recessed seats on the side towards the cells in correspondence of said through-holes; F3) insertion of conductive interface elements into said recessed seats and in correspondence of said through-holes in such a way that, on the side towards the cells, the surface of said backsheet and said conductive elements are integrated and aligned in a coplanar way and also in such a way that each conductive interface element is electrically connected to each terminal point of the circuit; F4) laying of the lower protective layer, positioning and electrical connection of the cells, laying of the upper protective layer and of the glass, rolling; F5) electrical connection of said integrated conductive elements, as in F3, to the junction box; F6) assembly of the junction box fixing it at the back of the photovoltaic panel. In more detail, with respect to the known art said assembly method has at least the following particular characteristics:

said phases (F1), (F2) and (F3) are combined and carried out simultaneously in one single initial macro-phase (MF1) of automated arrangement of the backsheet (101, 204) for the direct contacting of the junction box (141), as an alternative it being possible to use a standard backsheet (101) for conventional cells (120) or a conductive backsheet (204) for back-contact cells;

said phase (F1) of making of the through-holes (110, 210) and said phase (F2) of making of the recessed seats (111, 211) occur simultaneously and in an automated way within the production cycle;

in said phase (F3) the conductive elements (130a-d) which are with double contacting face (131, 132) are automatically inserted from above and are fixed, immediately after the making of said through-holes (110, 210) and of said recessed seats (111, 211) as in (F1) and (F2), in such a way as to be integrated in said recessed seat (111, 211) without crossing the thickness of the backsheet (101, 204) realizing for each element two opposite conductive bump contacts, resistant and stable, which correspond, respectively, to the first (131) and to the second (132) contacting face, the fixing being preferably automated and performed by means of welding or laying of conductive adhesive or by means of an equivalent system.

and wherein said phases (F5) and (F6) are combined and carried out simultaneously in one single final macrophase (MF2) of direct contacting of the junction box (141) where the electrical connection occurs after the rolling of the panel without manual operations and simultaneously to the assembly of the box (141) on the back side (114, 214), by means of the spring conductive elements (144a-d) which are fastened to said box (141, 143) in a protruding way and integral with it, to be inserted in a guided way into said through-holes (110, 210) and make a direct electrical connection, by contact, on said second face (132) of each integrated conductive element (130a-d).

According to the above-mentioned method and with particular reference to said initial macro-phase (MF1), for the purpose of making said backsheet (10, 20) equipped with said arrangement (110-2, 210-2, 130a-d) as provided by the invention (FIGS. 2,3), it is advantageous to use a production plant of the automatic type with operating stations placed in sequence, for example with a first station of loading of the backsheet (FIGS. 2a, 3a), standard (101) or conductive (204), with the front side (114, 214) intended to house the cells facing upwards being laid in an empty tray coming from a ring movement system with continuous recirculation; said tray can be combined with means, for example pneumatic and/or mechanical, intended to keep said backsheet in a correct position. Therefore, a first check is made by means of a first control device, for example a linear scanner, placed in a zone adjacent to said first station; said first control device is intended to check the position of the backsheet and determine the possible pre-existence of through-holes (110, 210) for the electrical connection to the back junction box (141). In the absence of such holes, said first device determines the coordinates to make, in a second station, the whole arrangement of the backsheet making first the holes and the recessed seats (112, 212) (FIGS. 2b, 3b) on which to lay and fix, immediately, afterwards (FIGS. 2c, 3c), said integrated double contacting face conductive elements (130a-d).

In order to make said arrangement (212) in a rapid and automatic way on a backsheet of the conductive type (204), as a non-exhaustive example one can use in said second station a shearing and/or rotating tool, also of the multifunction type such as the combined tool (300) (FIG. 6) which comprises a mobile upper part (310) with vertical translation which integrates at least the bending punch (311) and the shearing punch (312), and which also comprises a fixed lower part (320) which integrates at least the supporting plane (323) of the backsheet (101, 204), the die (321) and an outlet for the shearing scrap (322). Such a tool allows to create said openings (210) and to simultaneously make the recessed seats (211) intended to contain said integrated conductive elements (130a-d).

In order to fix firmly said integrated conductive elements (130a-d) in said recessed seats (111, 211) (FIGS. 2c, 3c) and complete the connections on the front side (114, 214) one can use known and conventional techniques such as contact welding, for example by short-circuit current, by induction, by ultrasounds or similar systems, or permanent conductive adhesion, for example using conductive welding material, conductive adhesive or a similar material. In an advantageous embodiment said conductive welding material instead of being introduced during the welding phase can be directly on the surface of the element itself to be welded being pre-coated, such as a tinned metal strip.

Once said integrated conductive elements (130a-d) have been laid and fixed, there is a second check by means of a second control device, which checks the actual location of said conductive elements in the backsheet. Such a backsheet (101, 204), so machined and arranged (FIGS. 2c, 3c), is then assembled and rolled according to the known techniques as in F4.

Afterwards, according to the method as in said final macro-phase (MF2), the finished panel (100, 200) (FIGS. 2d, 3d) is made by connecting electrically and fixing the junction box (141) on the back of the backsheet, said operations being combined and simultaneous, particularly easy and realizable with automatic devices. The junction box (141), as a non-exhaustive example, can be of the known and conventional type such as with an inward-open half-shell, perimeter gasket (145), external cables (146) and connector (147), but with the advantageous peculiarity of fastening said spring conductive elements (144a-d) in such a way as to be protruding, like front contacts, and intended to be inserted into said through-holes (110, 210) simultaneously to the assembly of said box (141), with no additional manual or mechanical operation aimed to electrical connection; said electrical connection, in fact, occurs only by means of the contact with said second face (132) exposed at the back. The stability and duration of said electrical connection can be reinforced by the introduction of conductive welding material. The fixing of said box, depending on its shape and structure, can occur according to the known techniques.

In an evolved embodiment of the invention, which is intended to further reduce the times and costs for assembling a photovoltaic panel of the back-contact type, it is possible to apply the above-described method in the automatic production of a conductive backsheet for panels of the back-contact type, which integrates the encapsulating and dielectric layer, for example as provided in ITTV2012A000211 (Baccini et al.), and is also advantageously arranged for the simplified contacting of the back junction box as provided by the present invention; in this way it is possible to obtain an innovative semi-finished product which reduces the times and the costs for assembling the panels intended for rolling and which also reduces the times and costs for assembling the back junction box, after rolling. Such an evolved solution, moreover, considerably increases the quality and durability of the finished product and reduces production waste.

REFERENCE

(10) non-conductive backsheet arranged for the simplified contacting of the back junction box according to the invention, (100) photovoltaic panel with cells of crystalline silicon with front and back contacting which comprises a non-conductive backsheet arranged for the simplified contacting of the back junction box, (101) non-conductive backsheet also called of the standard type, (101a) polymeric layer resistant to hydrolysis and to ultraviolet rays, (101b) dielectric polymeric layer,
(102) encapsulating layer,
(103) front glass,
(110, 210) through-hole of access to the contacts,
(111, 211) recessed seat,
(112, 212) arrangement for the integration of the double contacting face non-through conductive element,
(113, 213) cell supporting plane,
(114, 214) front side towards the cells,
(115, 215) back side towards the junction box,
(120) photovoltaic cell of crystalline silicon with front and back contacting,
(121) string of cells,
(122) head ribbon for the connection of the strings,
(123) terminal connection ribbon,
(124a-d, 221a-d) terminal point of the front circuit,
(130a-d) integrated double contacting face non-through conductive element,
(131) first contacting face, towards the cells,
(132) second contacting face, towards the junction box,
(140) terminal connection zone of the front circuit,
(141) junction box,
(142a-b) terminal,
(143) diode,
(144a-d) spring conductive element fastened inside the junction box,
(145) perimeter gasket,
(146) electric cable,
(147) connector,
(150) photovoltaic generator,
(151) resistor,
(152a-b) connection to the terminal,
(153) diode,
(154a-d) back connection point which corresponds to the terminal point of the front circuit,
(20) conductive backsheet arranged for the simplified contacting of the back junction box according to the invention,
(200) photovoltaic panel with cells of crystalline silicon of the back-contact type which comprises a conductive backsheet arranged for the simplified contacting of the back junction box,
(201a) polymeric layer resistant to hydrolysis and to ultraviolet rays,
(201b) dielectric polymeric layer,
(202) metal conductive layer which electrically connects the cells,
(203) openings which configure the conductive layer,
(204) conductive backsheet also called of the back-contact type,
(205) encapsulating layer,
(206) front glass,
(207) conductive adhesive,
(220) back-contact photovoltaic cell of crystalline silicon,
(300) tool for simultaneously making recessed seats and holes,
(310) mobile upper part with vertical translation,
(311) bending punch,
(312) shearing punch,
(320) fixed lower part,
(321) die,
(322) scrap outlet,
(323) backsheet supporting plane.

The invention claimed is:

1. A photovoltaic panel assembly comprising:
a photovoltaic panel with cells of crystalline silicon, said photovoltaic panel having conductive interface elements that are adapted to electrically connect terminal points of a front electrical circuit to a back junction box, each of the conductive interface elements being a rigid preformed element having a shape of a conductive disk or plate; and
a backsheet affixed to said photovoltaic panel, said backsheet having at least one recessed seat corresponding to the terminal points, the recessed seat having at least one through-hole, said backsheet having a plurality of integrated conductive elements of a non-through type with a double contacting face so as to form two opposite conductive bump contacts which correspond respectively to a first face and to a second face of the integrated conductive element, the integrated conductive element being inserted and fixed in the recessed seat such that said first face is coplanar to a surface of a front side of said backsheet, said integrated conductive element having a thickness corresponding to a depth of the recessed seat, the through-hole located inside said second face of the integrated conductive element in correspondence to the front electrical circuit, wherein each of the terminal points of the front electrical circuit is irreversibly electrically connected to each of the plurality of integrated conductive elements, wherein said second face faces the back side so as to enable electrical connection to the back junction box, said second face being visible and accessible through the through-hole.

2. The photovoltaic panel assembly of claim 1, wherein each of said plurality of integrated conductive elements has said first face facing said front side so as to electrically connect each terminal point by welding a conductive ribbon.

3. The photovoltaic panel assembly of claim 1, wherein each of said plurality of integrated conductive elements has said second face facing said back side so as to electrically connect each of the terminal points on a conductive layer.

* * * * *